United States Patent [19]
Yamamoto et al.

[11] Patent Number: 5,527,731
[45] Date of Patent: Jun. 18, 1996

[54] SURFACE TREATING METHOD AND APPARATUS THEREFOR

[75] Inventors: Seiji Yamamoto, Hachioji; Kozo Mochiji, Tokorozawa, both of Japan

[73] Assignee: Hitachi, Ltd., Tokyo, Japan

[21] Appl. No.: 149,941

[22] Filed: Nov. 10, 1993

[30] Foreign Application Priority Data

Nov. 13, 1992 [JP] Japan .................................. 4-303488

[51] Int. Cl.$^6$ ................................................. H01L 21/203
[52] U.S. Cl. .......................... 437/105; 250/281; 250/283; 250/489; 437/946
[58] Field of Search ...................... 437/946, 105; 148/DIG. 17; 250/281, 283, 489

[56] References Cited

U.S. PATENT DOCUMENTS

| | | | |
|---|---|---|---|
| 5,051,582 | 9/1991 | Bahns et al. | 250/283 |
| 5,223,711 | 6/1993 | Sanderson et al. | 250/283 |

FOREIGN PATENT DOCUMENTS

| | | | |
|---|---|---|---|
| 2255671 | 11/1992 | United Kingdom | 259/489 |

Primary Examiner—R. Bruce Breneman
Assistant Examiner—Ramamohan R. Paladugu
Attorney, Agent, or Firm—Antonelli, Terry, Stout & Kraus

[57] ABSTRACT

A surface treating method of the invention comprises the steps of generating mixed chemical species containing an intended chemical species of ions necessary for surface treatment by ionization of a gas, selectively trapping the intended chemical species from the mixed chemical species, exciting the intended chemical species to predetermined vibrational and electronic states, extracting the excited chemical species from a position where trapped, and subjecting the extracted chemical species to surface treatment on a surface of an article to be treated. In this method, the intended chemical species of ions which are under vibrational and electronic conditions effective for the surface treatment and have a certain mass number have been once trapped at a given position. The trapped ions are uniformly arranged with respect to their translational velocity and applied to a sample surface. Thus, dry etching with high anisotropy and high selectivity to material and deposition with good uniformity can be realized.

13 Claims, 10 Drawing Sheets

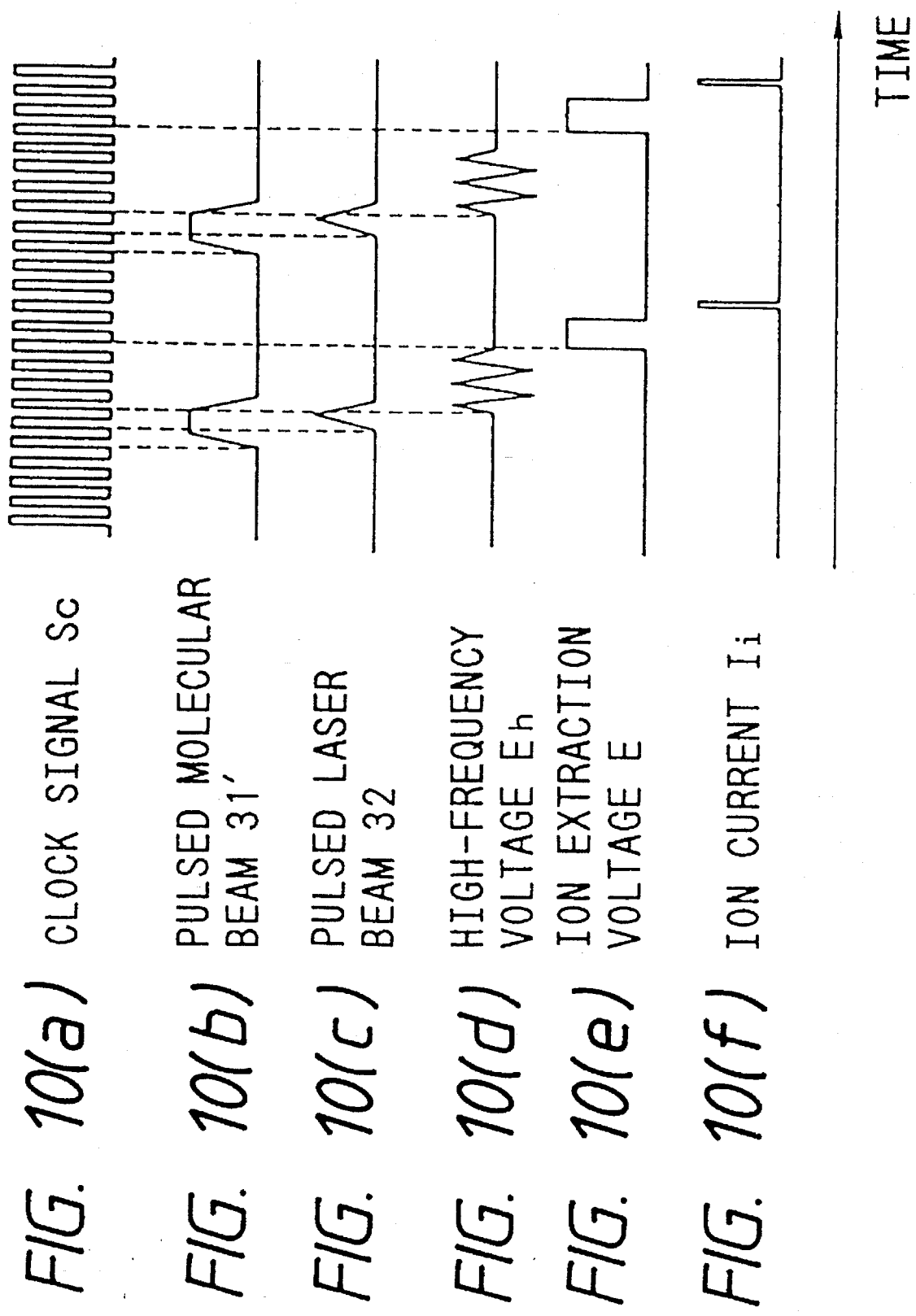

SURFACE TREATING METHOD AND APPARATUS THEREFOR

BACKGROUND OF THE INVENTION

This invention relates to a method for fabricating semiconductor devices and more particularly, to a method for realizing ultrafine processings as having high selectivity to material and high anisotropy in a surface treating procedure such as etching or deposition and also to an apparatus for carrying out the method. The term "ultrafine processings" used herein is intended to mean a surface treatment at the level of an atomic layer.

As semiconductor devices are now progressing in fineness, there is a demand for an etching procedure which ensures a higher aspect ratio (i.e. a ratio between an etching depth and an aperture size), with a higher selectivity to material.

In dry etching, a recent trend is to use ions or radicals of an etching gas which are produced in a plasma by application of a high frequency in the order of magnitude of MHz. The chemical species, such as ions, radicals, dissociated molecules and the like, generated in the procedure are various in kind and energy. For instance, $CF_4$ gas is dissociated in the following way

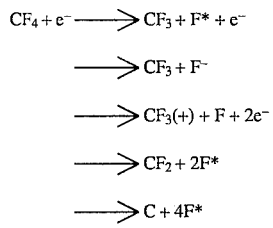

In the above sequence, $F^*$ represents a radical and $CF_3(+)$ represents a monovalent positive ion of $CF_3$. Thus, such a simple molecule as $CF_4$ will be changed into various chemical species in plasma. Additionally, in the prior art procedure, the internal energy of the respective chemical species is not controlled at all. However, although not satisfactory in anisotropy, the above procedure is advantageous in making use of the active species in large quantities, permitting etching to proceed at a high throughput.

This is true of the deposition procedure. More particularly, although thin films can be formed at a high throughput, the chemical species used are not selected and the internal energy is not controlled in this case.

In plasma etching, attempts have been hitherto made to effect a good quality of etching by use of chemical species effective in the etching while eliminating other chemical species unnecessary for the etching. For one instance, there may be mentioned a method set out in Japanese Patent Laid-open No. 62-248226. In this method, various ion species from a discharge plasma are subjected to mass separation by means of a quadrupolar electromagnet, thereby selectively taking out a specific type of ionic species having a desired energy. Subsequently, the resultant ion species are appropriately controlled in velocity by use of deceleration electrodes, following by processing a sample surface therewith. For the selection of ionic species, it is typical to use a quadrupolar mass separator using a high frequency and a Wien filter-type mass separator wherein a magnetic field and an electric field are intersected at right angles. For mass spectrometry, there is known a method which makes use of a quadrupolar ion trap as set forth in Japanese Patent Laid-open No. 59-134546. A light-assisted internal energy control method has been proposed, for example, in Japanese Patent Laid-open No. 61-231716. This method comprises irradiating light on a sample surface which is undergoing the etching reaction, thereby contemplating a good quality of etching.

In the known drying etching processes, there is used a plasma which is generated by application of a high energy. The resultant ions contain different types therein. Accordingly, the internal energies of rotation, vibration and electron of the ions and translational energies thereof vary widely. Among these ions, there are invariably included ions which are not necessary for etching or which are in an energy state where the etching reaction is unlikely to occur. Such ions undesirably act to etch a mask or an underlying layer, making it difficult to obtain high selectivity to material. In addition, since there are used ions which are accelerated and have a high translational energy in order to enhance the anisotropy of an etching shape, the selectivity to material will further lower. This will cause a variety of defective damages of the substrate. Moreover, the etching reaction becomes more complicated by the influence of various radicals and electrons generated along with the ions and are thus more unlikely to control.

SUMMARY OF THE INVENTION

An object of the invention is to provide a surface treating method which overcomes the problems of the prior art methods and which includes a dry etching process ensuring high selectivity and high anisotropy and also an apparatus for carrying out the method.

In order to achieve the above object, a light energy is utilized to ionize a surface treating gas, selectively trapping, from the resulting ions, ions which have an intended mass number in a certain internal energy state effective for the surface treatment, and subjecting the thus trapped ions to the surface treatment such as dry etching, deposition or the like.

More particularly, the surface treating method of the invention comprises the steps of subjecting a gas for surface treatment to ionization to generate mixed chemical species, selectively trapping an intended chemical species from the mixed chemical species, extracting the trapped chemical species, and subjecting the extracted species to surface treatment.

In order to control the internal energy state of the chemical species used for the surface treatment, the method may further comprise the step of irradiating the separated chemical species with light to excite the chemical species to the predetermined level of an internal energy state. The step order of the trapping, excitation and extraction steps may not be critical and may be changed depending on the type of chemical species used and the manner of the surface treatment.

Where neutral atoms or molecules are used as the chemical species for the surface treatment, the surface treating method of the invention comprises the steps of introducing an intended chemical species (or neutral atoms or molecules) necessary for the surface treatment into a vacuum chamber, trapping the chemical species by application of light from a direction opposite to the direction of movement of the introduced chemical species, extracting the trapped chemical species by use of the light, and subjecting the extracted chemical species (such as of neutral atoms or molecules) to surface treatment. Of course, the method may further comprises the step of exciting the chemical species by irradiation of light onto the trapped chemical species to the predetermined level of the internal energy state so that the internal energy state can be appropriately controlled.

FIG. 1 schematically shows a basic concept of the surface treating method according to the invention. As shown in the figure, the surface treating method of the invention fundamentally comprises the chemical species forming step (1), the chemical species trapping step (2), the chemical species exciting step (3), the chemical species extracting step (4) and the surface treating step (5).

In the step (1), a gas used for the surface treatment is ionized to generate a variety of chemical species 6, 7, 8 and 9 including an intended chemical species necessary for the surface treatment. The thus generated chemical species have, respectively, different mass numbers and thus, have different internal states and translational velocities.

In the step (2), an intended and specific type of chemical species 6 which is necessary for the surface treatment is selected and trapped from the various chemical species generated in the step (1).

In the step (3), individual chemical species 6 trapped in the step (2) are excited to a predetermined excitation level to make a uniform internal energy state thereof.

In the step (4), the chemical species 6 excited to the predetermined excitation level in the step (3) are extracted while the translational velocities of the individual chemical species 6 are controlled at a same level.

In the step (5), the chemical species 6 extracted in the step (4) are applied to the surface of a material to be treated to carry out the surface treatment.

The time sequence of the chemical species trapping, exciting and extracting steps (2), (3) and (4) may be appropriately changed depending on the type of chemical species used or the manner of the surface treatment.

The surface treating apparatus according to the invention comprises means for generating an intended chemical species used for the surface treatment, means for trapping the generated species, means for exciting the trapped species, means for extracting the excited species, and means for irradiating the extracted species onto a sample to be treated.

FIG. 2 shows a fundamental arrangement of the surface treating apparatus according to the invention. Broadly, the apparatus has three vacuum chambers including a gas introducing chamber 12, an intermediate treating chamber 13 and a sample treating chamber 26. The chambers can be, respectively, evacuated to vacuum by means of vacuum pumps 14, 15 and 16 through valves 17, 18 and 19.

In order that an intended chemical species of ions necessary for the surface treatment of the invention are generated in this apparatus, a surface treating gas capable of generating the intended chemical species is jetted into the gas introducing chamber 12 from a gas cylinder 25 through a fine hole by means of a pulse supersonic jet generator 20, thereby generating a pulse supersonic jet 31 of small droplets. The pulse supersonic jet 31 is then passed through a skimmer 21 into the intermediate treating chamber 13 as a pulse molecular beam 31'. This pulse molecular beam 31' is allowed to enter into an ion trap cell 22. Most molecules in the pulse molecular beam 31' are in a ground state. Within the cell 22, the molecular beam 31' is irradiated with a laser beam 32 or a synchrotron radiation, whereupon the molecules or clusters of the ground state in the molecular beam 31' are ionized, thereby generating chemical species containing an intended species (or ions) necessary for the surface treatment.

Subsequently, the thus generated intended chemical species are trapped. To this end, the ion trap cell 22 is worked to trap the intended chemical species alone in the cell 22.

For the excitation of the thus trapped chemical species, the trapped ions are irradiated with a laser beam 32' from a laser beam source 33 to permit the ions to be excited to a predetermined internal energy level.

Thereafter, the excited chemical species are extracted by forming an ion extracting electric field within the ion trap cell 22 so that the chemical species (such as of ions) in the cell are extracted to outside of the cell 22.

Finally, the chemical species (of ions) extracted from the cell 22 are irradiated on a sample surface. For this purpose, the ion stream is shaped in its section or the like by means of an ion optical system such as ion lenses 34, followed by irradiation of the surface of a sample 27 with the ion stream.

Although the molecular beam which is passed into the ion trap cell 22 is preferably such a pulse molecular beam as set out hereinabove, continuous molecular beams may be used in some cases.

Where the chemical species utilized for the surface treatment are neutral atoms (or molecules), the surface treating apparatus of the invention may comprise means for introducing chemical species necessary for the surface treatment as an atomic beam (or a molecular beam) into a vacuum chamber, means for trapping the chemical species by application of a light beam from a direction opposite to the direction of movement of the introduced chemical species, means for extracting the trapped chemical species by use of a light beam, and means for irradiating a sample surface with the extracted chemical species for the surface treatment of the sample. In this case, the apparatus may further comprise means for exciting the trapped chemical species to a predetermined level of its internal energy so as to control the internal energy state of the chemical species to be used for the surface treatment. The beam of the chemical species which is introduced into a vacuum chamber should preferably be a pulse beam although a continuous beam may be used in the practice of the invention.

Moreover, where the chemical species to be trapped is neutral atoms (or molecules), the trapping means may be one wherein the chemical species to be trapped is decelerated according to a laser cooling method using a resonance frequency laser beam and trapped. Likewise, the exciting means may be one wherein the trapped species are irradiated with a laser beam to cause photo-excitation of the chemical species. The extracting means may be so arranged that the trapped chemical species (neutral atoms or molecules) are irradiated with a laser beam and extracted by the action of the radiation pressure of the beam.

The surface treating method and apparatus of the invention are described in more detail along with the features and advantages thereof. For convenience' sake, dry etching is described as the surface treatment, for example.

In the practice of the invention, chemical species which are in certain rotational, vibrational and electronic states (hereinafter referred to vibronic state) with similar mass and translational velocity are generated by application of a light beam to ՝ starting gas. The chemical species are used to etching of sample surfaces.

In the chemical species generation step (1), an etching gas is introduced into a high vacuum chamber in the form of a pulse molecular beam. On jetting a highly pressurized gas through a fine hole pulsatively into high vacuum, a supersonic pulse molecular beam can be generated. Most of the resultant gas molecules in the pulse molecular beam are in a ground state owing to the adiabatic expansion with a uniform translational velocity. The irradiation of the pulse molecular beam with a laser beam or a synchrotron radiation having a certain wavelength results in ionization of the molecules or clusters in the molecular beam, thereby permitting an intended chemical species (ions, dissociation species of the ions) necessary for etching to be generated. Needless to say, as shown in FIG. 1, various chemical species other than the intended species are simultaneously generated.

In the species trapping step (2), the intended chemical species (such as of ions having a predetermined mass) are selectively trapped by use of the ion tap cell 22 as shown in FIG. 4 for separation from other various chemical species. The trapping procedure is described with reference to FIG. 4. Starting materials used to generate the chemical - species intended for the surface treatment include halides such as $F_2$, $Cl_2$, $Br_2$, $I_2$, $CCl_4$, $CHCl_3$, $CCl_3$, $CHF_3$, $SF_6$, $HF$, $HCl$, $HBr$, $HI$, $NF_3$ and $WF_6$, oxides, hydrides, nitrides and inorganic complexes, and mixtures thereof. These starting materials may be in a gaseous or liquid state on use. A material capable of generating necessary chemical species for a desired surface treatment is selected from the above materials. The material is passed through the fine hole and jetted into vacuum pulsatively, by which the pulse molecular beam 31' is formed. The reason why the pulsed jetting is necessary is that when intended chemical species of ions are selectively trapped in the ion trap cell 22, other additional chemical species which have to be removed from the ion trap cell 22 are reduced in amounts of the introduction and thus, the pressure increase in or around the ion trap cell 22 is suppressed. In the ion trap cell 22, a high frequency voltage $Eh=U+V\sin\omega t$ (wherein U represents a DC voltage component and $V\sin\omega t$ represents a high frequency voltage component) is applied between a ring electrode 40 shaped in the form of a hyperboloid of revolution and cap electrodes 39, 39'. As a result, a three dimensional quadrupole electric field is formed within the cell, permitting selection and trapping of intended ions (FIG. 4(a)).

When the molecular beam 31' introduced into the cell 22 is transmitted at the central portion of the cell 22, light 32 is irradiated against the molecular beam 31', so that the introduced molecules 35 are ionized (FIG. 4(b)).

Simultaneously with or immediately after the ionization, the high frequency voltage Eh is applied between the ring electrode 40 and the cap electrodes 39, 39' by use of a high frequency power source 37, whereupon the high frequency electric field is formed within the cell 22. The neutral molecules 35 which have not undergone ionization are not influenced by the high frequency electric field. Thus, the molecules 35 are discharged, as they are, to outside of the cell 22 such as through an opening 40B. Among the ions generated by the ionization, there are included parent ions 36 and fragment ions 38 generated from the introduced molecules 35 which have been ionized as they are. Because ions which have different mass numbers move along different orbits within the high frequency electric field, respectively, proper control of the applied high frequency electric field with respect to the amplitude and frequency allows ions with a predetermined or specific mass number (e.g. ions 36 of FIG. 4) adapted for trapping conditions to be trapped without failure. The ions which are not adapted for the trapping conditions (e.g. the ions 38 of the figure) are forced to be scattered outside the cell by the action of the high frequency electric field. Thus, only the ions having a predetermined mass number whose internal states are kept as uniform as possible can be trapped within the ion trap cell 22 (FIG. 4(c)). This ion trapping technique is described in detail, for example, in "Mass Spectrometry" V1.36, No.5, 187–195(1988).

Then, in the chemical species exciting step (3), the ions trapped in the cell 22 are excited by application of light, thereby generating ions or dissociated species of the ions in a certain vibronic state. It will be noted that the exciting step (3) may be carried out immediately after the formation of the intended ion species in the step (1). Reference is now to FIG. 3 to illustrated an exciting method wherein three light beams having different energies are used to excite intended molecules thereby generating intended ion species. Then, the thus generated intended ion species are further excited to provide ions having intended vibronic state.

As shown in FIG. 3, the molecules 35 in the supersonic pulse molecular beam generated in the previous formation step (1) are in a ground state since they are cooled owing to the adiabatic expansion thereof. The molecules 35 in the ground state absorb first light (energy: $h\nu_1$), followed by transition into an intermediate state having a high energy. The molecules 35' in the intermediate state further absorb second light (energy: $h\nu_2$) thereby emitting electrons and undergo the transition into the ground state of positive ions 36. The positive ions in this ground state further absorb third light (energy: $h\nu_3$) and are converted into ions 36' in intended, specific vibronic state. With molecular ions having a high energy, they may be not be stayed in the specific vibronic state depending on the type of ion because of the relaxation phenomena such as dissociation. In the case, the chemical species are distributed with respect to the internal state thereof, but the state can be selected to an extent as severely as possible. If exciting light energies are properly controlled as required, ions in the intended vibronic state can be formed through arbitrary intermediate states. Preferably, not less than 50% of the chemical species used should be those species having the same internal state. From the standpoint of not damaging substrates on etching, the internal energy should preferably be smaller than 100 eV in total with the translational energy.

In the chemical species extracting step (4), the intended ion species, which has been trapped in the cell 22 and excited to intended vibronic state, are extracted from the cell to outside. This procedure is illustrated with reference to FIG. 5. The ions 36' within the ion tap cell 22 are continued to be trapped within the cell 22 so far as the high frequency voltage Eh is applied between the ring electrode 40 and the cap electrodes 39, 39' (FIG. 5(a)). It is preferred that the trapped time is within a range of several milliseconds to several hundreds milliseconds.

The trapped ions 36' are extracted in such a way that prior to or after termination of the application of the high frequency voltage Eh from the high frequency power source, an ion extracting voltage E is applied from a DC current powder source 37' between the cap electrodes 39, 39'. Preferably, the translational velocity distribution is arranged within ±5% around a preset average velocity. This is because the uniformity of the surface treatment is enhanced. In order to suppress the substrate from being damaged during the course of the surface treatment, the translational energy should preferably be not higher than 100 eV. When the ions 36' are extracted toward the direction different from the direction of the molecular beam 31' as in the apparatus shown in FIG. 2, it is possible to prevent arrival of unnecessary, non-ionized chemical species 35 at the sample surface.

Through a series of the working steps as set out hereinabove, there is formed an ion stream 36' consisting of chemical species which have only small dispersions of the internal energy and the translational velocity (with respect to both of the degree and the direction) and are effective for etching (FIG. 5(b)). By this, dry etching is feasible with good anisotropy and selectivity (FIG. 5(c)). This enables deposition of a uniform film quality (FIG. 5(d)).

Where the surface treatment is performed using neutral atoms (or neutral molecules), there is used an apparatus as shown in FIG. 1 wherein while the ion trap cell 22 is stopped working, neutral atoms or neutral molecules) in the atom beam (or molecular beam) are decelerated according to a laser cooling method and trapped. Subsequently, the trapped neutral atoms (or neutral molecules) are extracted by utilizing the radiation pressure of light and applied for the surface treatment. This permits the surface treatment in a reduced degree of damages.

As will be apparent from the above, intended chemical species which are necessary for surface treatment are isolated and trapped, and the trapped chemical species are excited with actinic light. The excited chemical species are arranged uniform with respect to the velocity and extracted, so that the resultant beam is composed of chemical species which have uniform internal and translational energies.

The features and advantages of the invention are then described, for example, in case where the ion trap technique is applied to drying etching of the surface of a Si substrate on which a fine resist pattern has been formed as an etching mask.

First, using the ion trap method, only chemical species which are effective in etching an intended Si substrate can be selectively utilized. Accordingly, selectivity to material in the etching is improved. The parent ions which are directly ionized without involving dissociation of atom ions or molecules have a selected internal energy. The selective use of ions whose internal state is effective for etching leads to a further improvement in selectivity to material. This is because if internal energies differ for the same chemical species, likelihoods of a chemical reaction occurring differ from each other.

Moreover, the translational velocity of the chemical species used for etching may be appropriately controlled. More particularly, after selected chemical species have been once trapped, they are extracted, so that the translational energy and the direction of the movement of the chemical species can be arranged properly. This will contribute to suppressing the enlargement of the direction of the movement owing to the collision between chemical species, resulting in an improvement in etching verticality. In other words, etching anisotropy is improved. The selected chemical species have been once trapped and then extracted, with the result that the energy imparted to the chemical species can be lessened, thereby suppressing damages on the substrate.

The ions used for the surface treatment may be generated not only by photo-ionization of the molecular beam, but also by electron bombardment or by bombardment of Rydberg atoms and molecules (i.e. atoms and molecules in a highly excited Rydberg state). Alternatively, there may be used a technique wherein ions (positive or negative ions) which are generated in plasma caused by RF discharge, arc discharge, glow discharge or electron cyclotron resonance (ECR). In all the cases, similar results are obtained.

The individual means of the surface treating apparatus according to the invention are ones which are ordinary in prior art. In the practice of the invention, these means are properly used in combination, enabling a high level of surface treatment as will not be expected in prior art. More particularly, ions necessary for the surface treatment are generated in the ion trap cell and are trapped over a long time to selectively separate them from other unnecessary ions. During the time, the ion are excited to intended vibronic state by irradiation with light. The ion trapping and exciting procedures will be unlikely to be realized by a conventional method using a quadrupole mass separator or a transmission-type mass separator such as a Wien filter as set out in Prior Art. Unlike light-assisted methods wherein light is merely irradiated, the excitation of ions in the practice of the invention is carried out while selecting light rays whose wavelengths are adapted for optimumly exciting intended ions. After the ions have been once trapped, the ions are subsequently extracted. During the course of these steps, there can be formed an ion beam which has internal and translational energies arranged properly. Thus, the catch of the ion allows the control in state of the ions. The state-controlled ions enable a fine and high-quality surface treatment, with high selectivity to material and high anisotropy.

BRIEF DESCRIPTION OF THE DRAWINGS

FIG. 10 is a timing chart showing a time sequence of a series of the steps in the surface treating method according to the invention.

DESCRIPTION OF THE PREFERRED EMBODIMENTS

Figure 1:
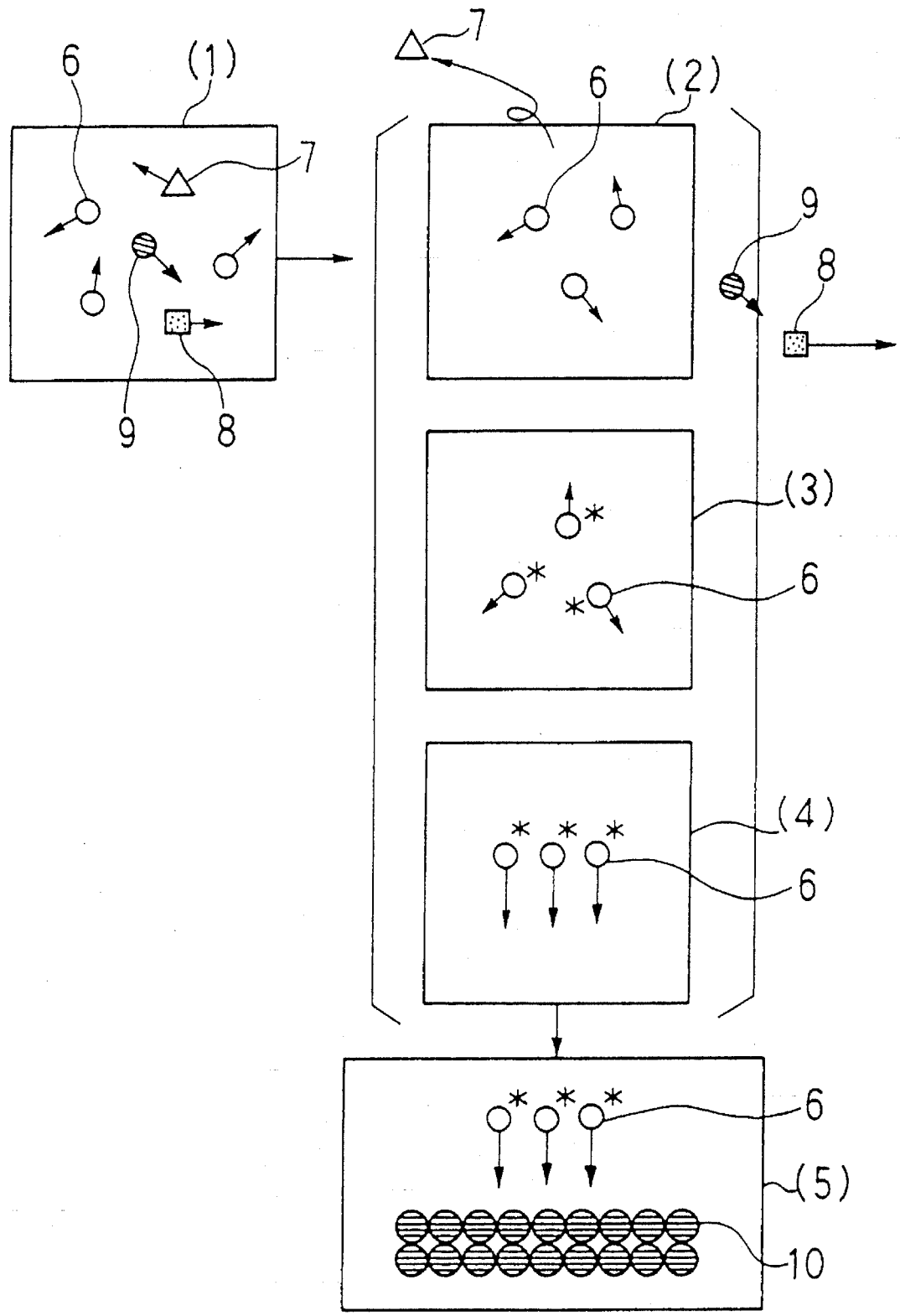
FIG. 1 is a schematic view showing a fundamental concept of a surface treating method according to the invention.

The embodiments of the invention are described in detail with reference to the accompanying drawings in which like reference numerals indicate like members or parts unless otherwise indicated.

Example 1

Figure 2:
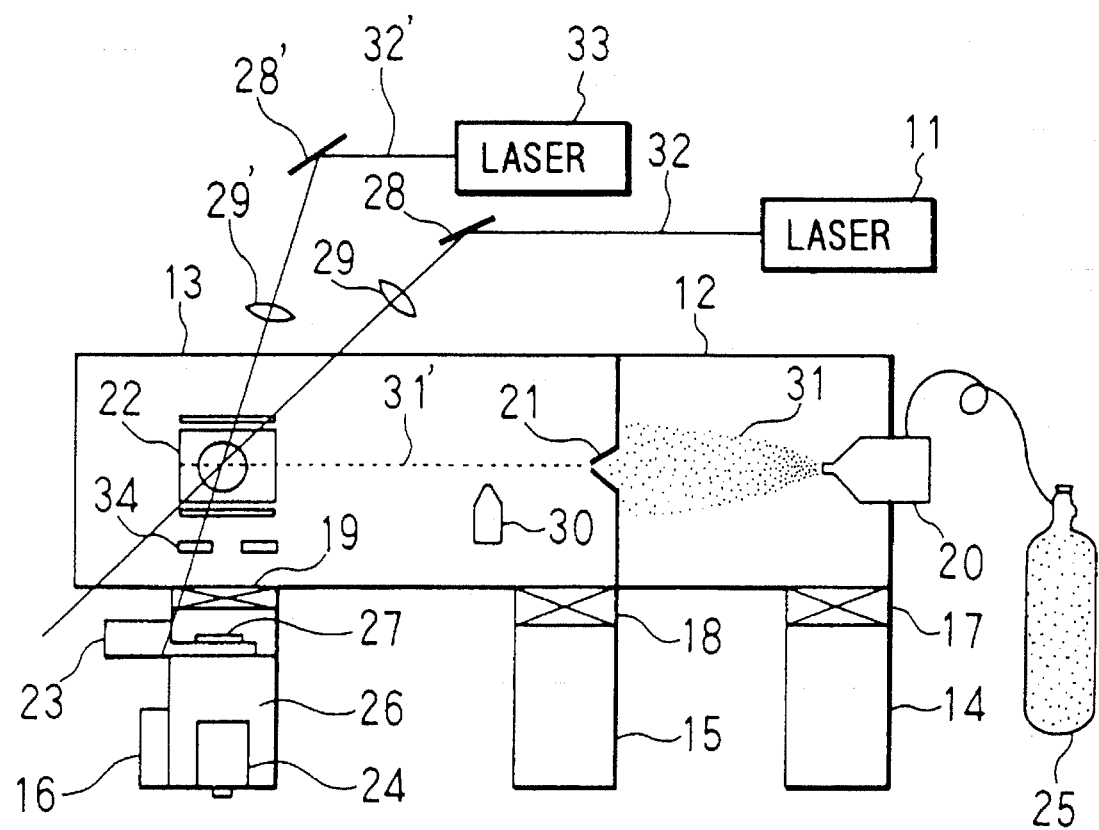
FIG. 2 is a schematic illustrative view showing a fundamental arrangement of a surface treating apparatus using an ion trap technique according to the invention.
Figure 3:
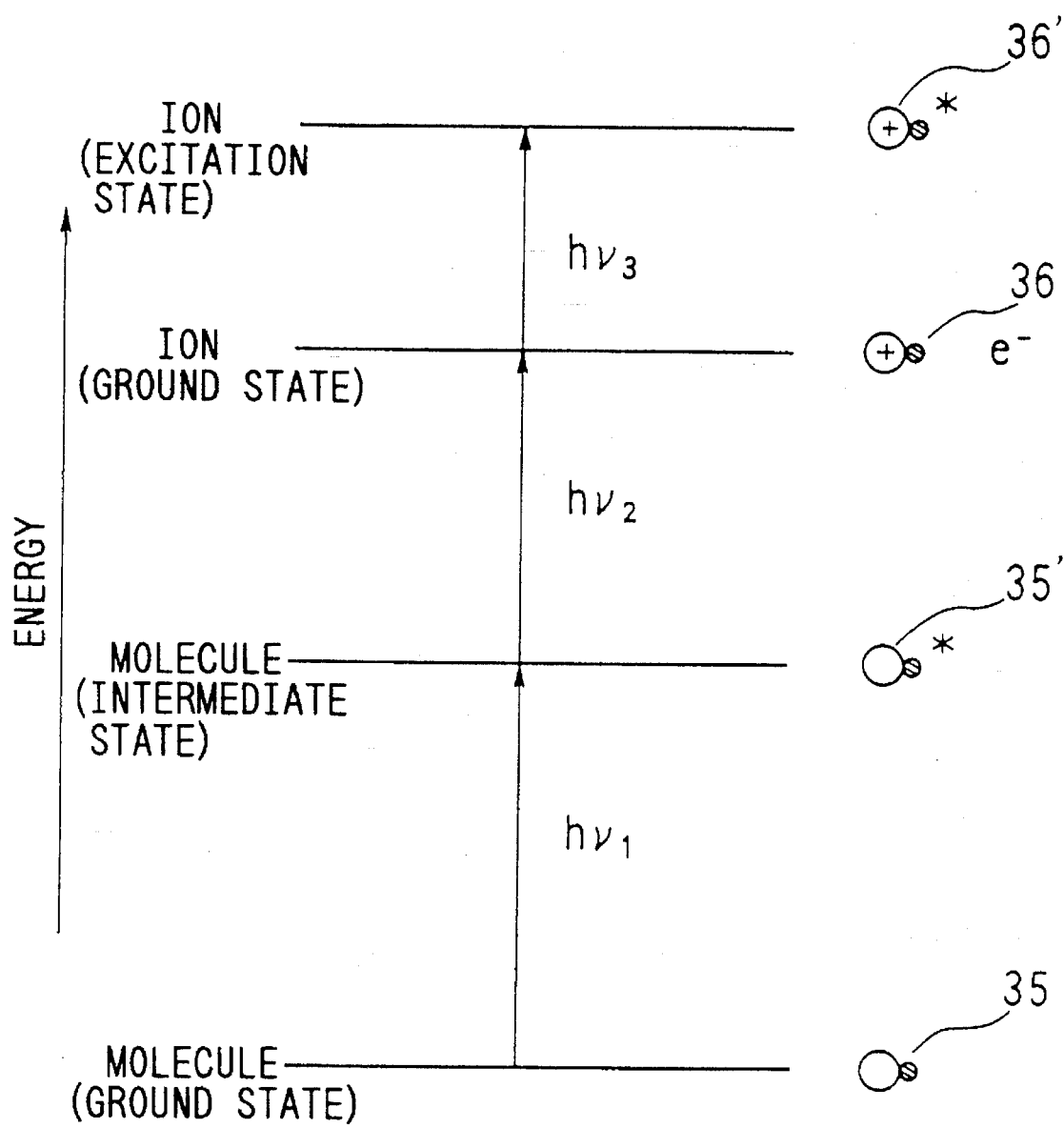
FIG. 3 is a schematic illustrative view showing different ionization states of a molecule or cluster by application of different three light energies, respectively.
Figure 4A:
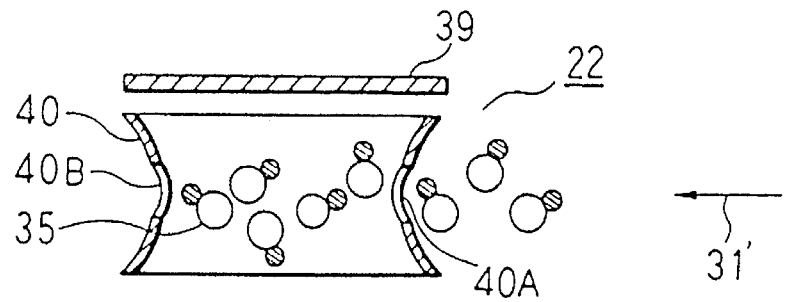
FIGS. 4(a) to 4(c) are, respectively, schematic illustrative views showing the manner of forming ions by light irradiation in an ion trap cell and trapping the ions by application of a high frequency according to the invention.
Figure 4B:
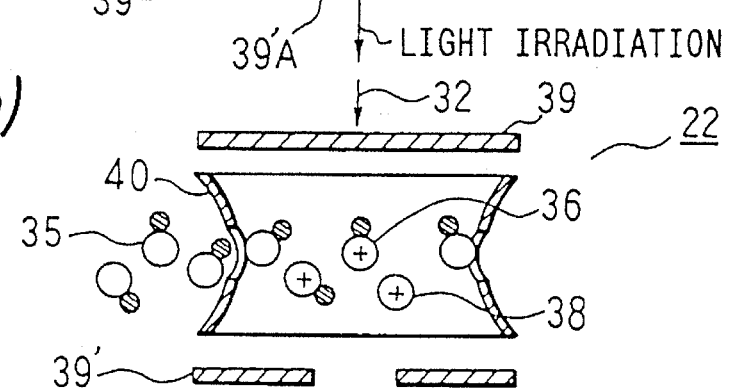
Figure 4C:
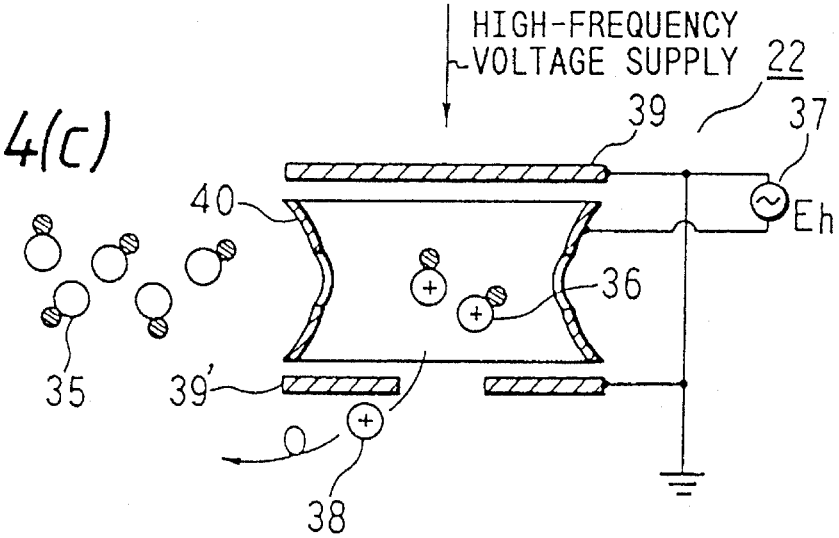

FIG. 2 schematically shown an arrangement of a surface treating apparatus according to one embodiment of the invention. The apparatus has three vacuum chambers including a gas introducing chamber 12, an intermediate treating chamber 13 and a sample treating chamber 26. The gas introducing 12 is connected to a vacuum pump 14 through a valve 17. The intermediate treating chamber 13 is connected to a vacuum pump 15 through a valve 18. A skimmer 21 is provided between the gas introducing chamber 12 and the intermediate treating chamber 13, both of which are communicated with each other through a fine hole of the skimmer 21. These chambers are differentially evacuated such that the intermediate chamber 13 is higher in degree of vacuum than the gas introducing chamber 12. The sample treating chamber 26 is evacuated to vacuum through a vacuum pump 16. A valve 19 is provided between the intermediate treating chamber 13 and the sample treating chamber 26, with which it is allowed to have both chambers opened or closed.

In the chamber 12, there is provided a supersonic jet generator 20 for jetting a gas, fed from a gas bomb 25, in the form of a pulse supersonic jet 31. The intermediate chamber 13 has an ion trap cell 22, an electron gun 30 and an ion lens system 34 therein. The chamber 26 has a sample holder 23 for placing a sample 27 in position and holding it, and a mass analyzer 24.

Figure 5A:
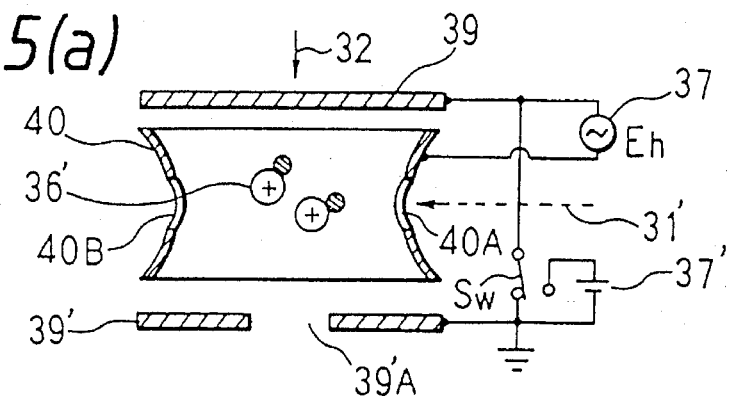
FIGS. 5(a) to 5(d) are, respectively, schematic illustrative views showing the manner of trapping the ions in an ion trap cell and extracting the ions from the cell, and also of the manner of surface treatment with the extracted ions.

As is particularly shown in FIG. 5(a), the ion trap cell 22 consists of two cap electrodes 39, 39' and a ring electrode 40 provided therebetween in the form of a hyperboloid of revolution. A high frequency power source 37 is connected between the ring electrode 40 and both cap electrodes 39, 39'. A potential of $Eh=U+V\sin\omega t$ (wherein U represents a DC voltage component and $V\sin\omega t$ represents a high frequency voltage component) from the power source 37 is applied to the ring electrode 40 under conditions where the cap electrodes 39, 39' are placed to ground, thereby forming a three-dimensional quadrupole electric field. By this, intended ion species are selectively collected and trapped. A DC power source 37' is to form an ion-extracting electric field in the cell by application of a positive voltage E to the cap electrode 39 through a switch Sw. It will be noted that at the side walls of the ring electrode 40, there are provided through-holes 40A. 40B through which a molecular beam 31' is passed and that the cap electrode 39' has a through-hole 39' through which ions are extracted.

The apparatus of FIG. 2 further comprises a pulse laser 11 capable of emitting a pulse laser beam 32 in a visible or ultraviolet region and a wavelength variable laser 33 capable emitting a laser beam 32' for excitation of internal state. Both laser beams 32, 32' are, respectively, introduced into the ion trap cell 22, provided in the intermediate treating chamber 13, through mirrors 28, 28' and lenses 29, 29', It will be noted that for introducing the laser beams 32, 32' into the ion trap cell 22, the cap electrode 39 may be formed with a through-hole or part or all of the cap electrode 39 may be made of a material capable of transmitting the laser beams therethrough.

In operation, the valves 17, 18 and 19 are initially opened. The gas introducing chamber 12, intermediate treating chamber 13 and sample treating chamber 26 are, respectively, held in high vacuum by means of the vacuum pump 14, 15 and 16. Then, the pulse supersonic jet generator 20 is operated to cause $SF_6$ gas to be jetted from the gas bomb 25 into vacuum through a pinhole at a pressure of 3 atm., thereby generating a pulse supersonic jet 31 of the $SF_6$ gas. The pulse supersonic jet 31 is passed through the fine hole of the skimmer 21 to form a pulse molecular beam 31' of the $SF_6$ gas. This pulse molecular beam 31' is introduced into the ion trap cell 22. IN some cases, the skimmer 21 may be removed so that $SF_6$ gas is introduced into the cell 22 in the form of the jet stream.

The pulsed molecular beam 31' of the $SF_6$ gas introduced into the cell 22 is irradiated with the pulse laser 32 in synchronism with the pulse molecular beam 31' with respect to the introduction timing, by which $SF_6$ gas molecules are ionized. Under these conditions, the high frequency power source 37 is operated to select intended ion species such as, for example, $SF_5+$ and catch them within the cell 22 during a time of from one millisecond to 100 milliseconds. The thus trapped ion species 36 are further irradiated with the laser beam 32' from the wavelength variable laser 33. As a result, the ion species 36 are excited to intended vibrational and electronic levels to provide the intended ion species 36' whose internal state is uniformly controlled.

Figure 5B:
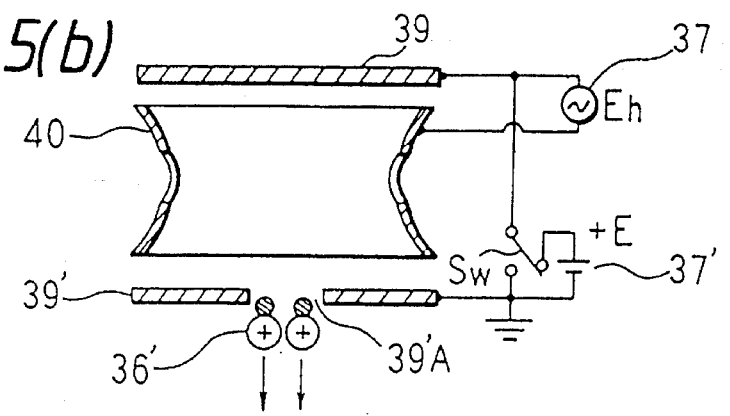
Figure 5C:
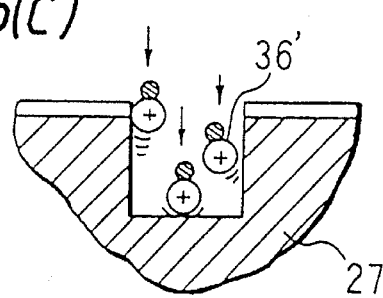
Figure 5D:
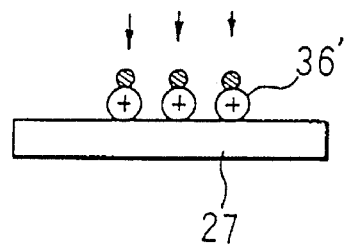

In this condition, the switch Sw is changed over to the DC power source 37' as shown in FIG. 5(b) to apply a positive potential (+E) to the cap electrode 39, thereby forming a DC electric field of about 50 V/m to 200 V/m between the cap electrodes 39, 39'. Thereafter, the ion species 36' can be extracted through the through-hole 39'A. The thus extracted ions are imparted with a kinetic energy of several tens eV. The direction of movement of the ions should preferably be arranged as uniformly as possible from the technical standpoint, for example, by improving the degree of vacuum in the cell 22 or by suppressing the disturbance of the electric field.

The thus extracted ions are subsequently introduced into the sample treating chamber 26. In the chamber, it is checked by means of the mass analyzer 24 whether or not the actually extracted ions are of desired or intended ion species. A sample 27 to be surface treated is placed in position by introducing the sample holder 23 at an ion irradiation position, followed by dry etching of the sample surface.

In fact, when a Si substrate having a resist pattern with a thickness of 0.3 μm and an opening width of 0.1 μm was provided as the sample to be etched and was dry etched for 60 minutes, a groove with a width of 0.1 μm and a depth of 0.5 μm (aspect ratio: 5) could be formed on the surface of the Si substrate.

If the ions from the cell 22 are converged by use of an ion lens system 34 as required, a shorter time will be sufficient to carry out such a dry etching procedure as set out above. Moreover, the etching speed may be further increased by irradiating light around the sample surface or by using assisted beams such as of atoms, molecules, electrons, ions or radicals, simultaneously with the irradiation of the ions on the sample surface.

The excitation beam for ionizing the molecules introduced into the ion trap cell 22 may include not only the above-indicated laser beam 32, but also lamp light, synchrotron radiation light, electrons and highly excited Rydberg atoms and molecules.

In this example, the three conditions of the mass number, translational velocity and internal state of the ion used to irradiate sample surfaces therewith are selected. In some cases, etching may proceed well by satisfying only one to two of these conditions. When the ion are formed within the cell, a small number of ions recoil to outside of the cell irrespective of the application timing of the ion extracting voltage E. Accordingly, it is preferred that the voltage applied to the ion lens system 34 is properly modulated so that any ions having nothing to do with the etching are not arrived at sample surfaces. The starting materials for generating ions include halides such as $F_2$, $Cl_2$, $Br_2$, $I_2$, $CCl_4$, $CHCl_3$, $CCl_3$, $CHF_3$, $SF_6$, HF, HCl, HBr, HI, $NF_3$ and $WF_6$, oxides, hydrides, nitrides and inorganic complexes, and mixtures thereof. The starting material is properly selected from these materials in the form of a gas or liquid.

A series of the steps set forth hereinabove are illustrated using a timing chart of FIG. 10. First, a clock signal Sc is generated as a reference (FIG. 10(a)). The pulse supersonic jet generator 20 is operated in synchronism with the clock signal Sc, thereby generating the pulse supersonic jet 31, followed by generation of a pulse molecular beam 31' through the skimmer 21 (FIG. 10(b)). After a time difference until the pulse molecular beam 31' arrives at within the ion trap cell 22, the pulse laser beam 32 is irradiated in the cell 22 wherein the molecules are ionized (FIG. 10(c)). Simultaneously with or slightly before the ionization through the pulse laser irradiation, the high frequency voltage Eh is applied between the cap electrodes 39, 39' and the ring electrode 40. Eventually, among the ions generated by the ionization, intended ions are trapped within the cell 22 (FIG. 10(d)). During the time when the high frequency voltage Eh has been applied, the intended ions are continuedly trapped. Within this trapping time, the ions are excited and the degree of vacuum in the cell is enhanced. After a required time of the catch, the ion extracting voltage E is applied to the upper cap electrode 39, so that the ions trapped in the cell are extracted to outside of the cell (FIG. 10(e)).

The timing of applying the ion extracting voltage E may be the time at which the high frequency voltage Eh is being applied, or may be after completion of the application of the high frequency voltage Eh. In the latter case, the ion concentration may lower more or less. Of course, the ion extracting voltage E may be applied simultaneously with the application of the high frequency voltage Eh stopped. The thus extracted ions arrive at the surface of a sample 27 after a time corresponding to their speed and flying distance and are observed as an ion current Ii (FIG. 10(f)).

Example 2

Another embodiment of the invention is described in a manner similar to Example 1 with reference to FIGS. 2 and 5. In this embodiment, the valves 17, 18 and 19 are opened. The gas introducing chamber 12, intermediate treating chamber 13 and sample treating chamber 26 are, respectively, evacuated to high vacuum by means of the vacuum pumps 14, 15 and 16. Thereafter, a mixed gas of He and $SF_6$ from the bomb 25 is pulsatively jetted from a pinhole into vacuum at a pressure of 3 atms., by means of the pulse supersonic jet generator, thereby generating a pulse supersonic jet 31. The pulse supersonic jet 31 is further passed through a fine hole of the skimmer 21 to provide a cluster beam 31' consisting of the He/$SF_6$ mixed gas. The cluster beam 31' is irradiated with an electron beam from the electron gun 30, so that the neutral clusters in the cluster beam 31' are ionized. The thus ionized cluster ions are introduced into the ion trap cell 22. It will be noted that the electron gun 30 may be placed in the ion trap cell 22. The ionization may not be limited to the above-descried method using the electron bombardment, but may be carried out by an ionization technique using bombardment of highly excited atoms or molecules.

Within the ion trap cell 22, specific cluster ions such as, for example, $(SF_6)SF_6+$, are selectively separated and trapped within a time of from one millisecond to 100 milliseconds according to the high frequency application method in the same manner as in Example 1. Similar to Example 1, the ion extracting voltage E is applied between the cap electrodes 39, 39' to form an electric field of 50 V/m to 200 V/m within the cell 22, by which the cluster ions trapped in the cell are extracted from the cell. The thus extracted cluster ions are imparted with a kinetic energy of about several tens eV. The extracted cluster ions are introduced into the sample treating chamber 26 wherein it is confirmed by use of the mass analyzer 24 whether or not the cluster ions are intended ones. Thereafter, a sample 27 is placed in position by use of the sample holder 23 and subjected to dry etching on the surface of the sample for 70 minutes. As a result, a groove pattern having a width of 0.1 μm and a depth of 0.6 μm (aspect ratio: 6) can be formed on the sample (Si substrate) surface.

Example 3

Figure 6A:
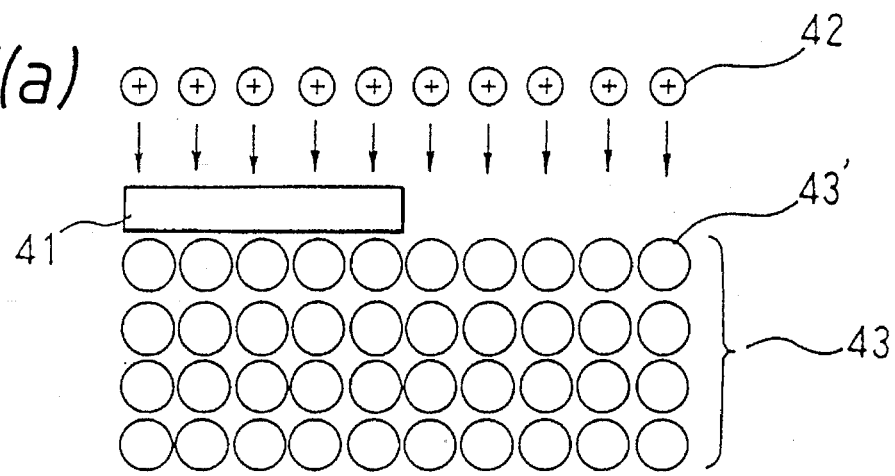
FIGS. 6(a) to 6(c) are, respectively, schematic illustrative views showing a concept of atom layer etching according to one embodiment of the invention.
Figure 6B:
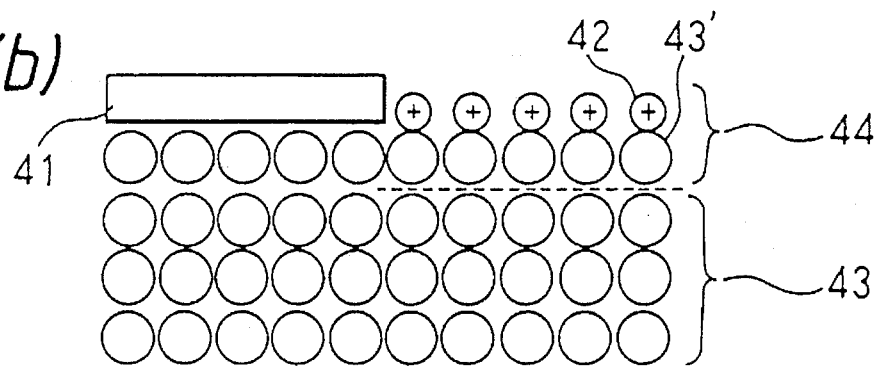
Figure 6C:
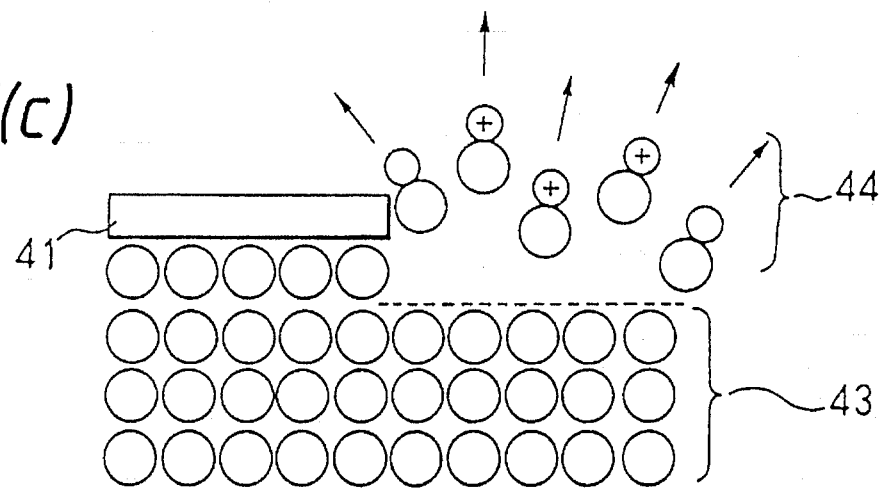
Figure 7A:
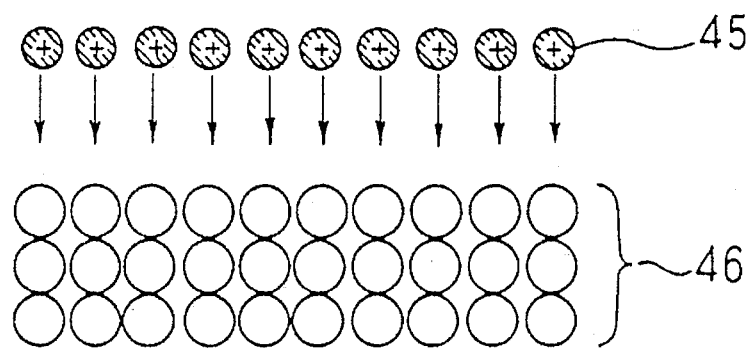
FIGS. 7(a) to 7(d) are, respectively, schematic illustrative views showing a conception of deposition at an atom layer level according to another embodiment of the invention.
Figure 7B:
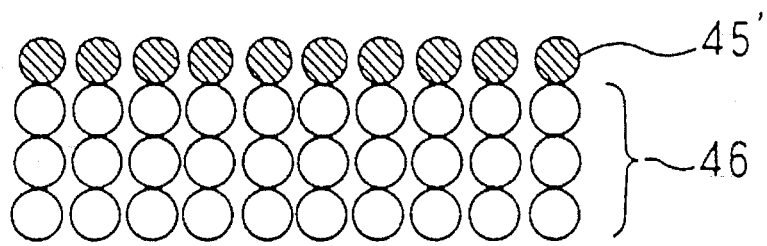
Figure 7C:
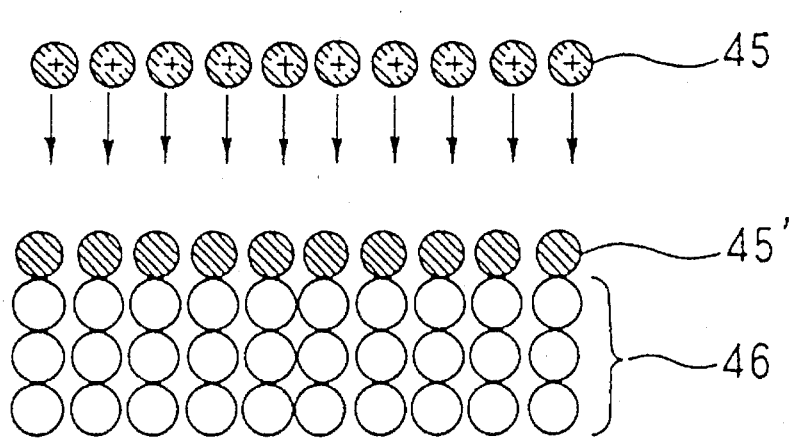
Figure 7D:
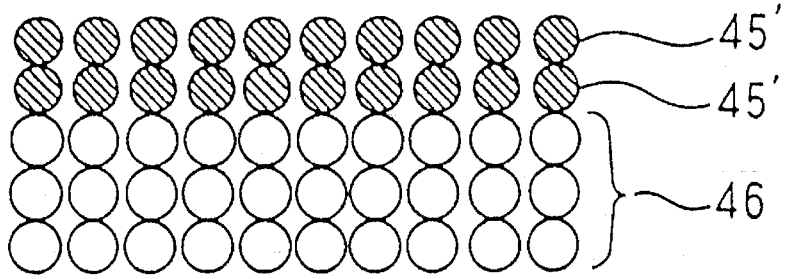

FIG. 6 shows a further embodiment of the invention. In this embodiment, atom layer digital etching is carried according to the invention.

First, chlorine ions 42 are formed in face-to-face relation with the surface of a GaAs substrate 43 and trapped. Preferably, the chlorine ions 42 are so trapped that they are kept within a two-dimensional plane as parallel to the sample surface as possible. The thus trapped chlorine ions 42 are irradiated on the surface of the GaAs substrate 43 through a pre-formed pattern mask 41 (FIG. 6(a)). The chlorine ions 42 arrived at the surface of the substrate 43 react with atoms 43' at the uppermost surface layer of the substrate to form a reaction product 44 (FIG. 6(b)). The reaction product 44 releases from the surface of the substrate 43 (FIG. 6(c)). At the time, the chlorine ions irradiated on the substrate surface are imparted with an energy which is optimum for etching the monolayer in the substrate surface. Preferably, the translational energy of the chlorine ions 42 should be several tens eV.

The ions extracted from the ion trap cell described hereinbefore are uniform in velocity. Accordingly, at one irradiation cycle, it is unlikely that a plurality of chlorine ions arrive at the same spot on the substrate surface with a time difference. Accordingly, the monolayer of the substrate surface ca be selectively digital-etched. In order to improve the reaction efficiency, chlorine may be adsorbed on the substrate surface in appropriate amounts prior to the reaction, on which the intended ions having a uniform velocity and extracted from the trap cell are irradiated.

Example 4

FIG. 7 shows a further embodiment of the invention. This examples deals with deposition of a thin film on a substrate according to the method of the invention.

In this embodiment, an organometallic complex is used as a starting gas for generating ions. In the same manner as in Examples 1 and 2, dissociated metallic ions 45 are generated and trapped. In the case, it is preferred that the dissociated metallic ions are trapped within a two-dimensional plane as parallel to a sample surface as possible. Subsequently, the trapped metallic ions 45 are irradiated on the surface of a Si substrate 46 (FIG. 7(a)). In order to suppress secondary sputtering which may occur on the substrate surface, the energy imparted to the irradiation ions should preferably be as small as possible. The dissociate metallic ions 45 arriving at the surface of the substrate 46 are dissociated into metallic atoms 45', followed by deposition on the substrate surface (FIG. 7(b)). As set forth hereinbefore, the metallic ions extracted from the ion trap cell have a uniform velocity. Accordingly, with a single ion irradiation, it is unlikely that a plurality of the dissociated metallic ions arrive at the same spots on the substrate surface with a time difference. Thus, the metallic atoms 45 produced by the dissociation can be deposited on the substrate surface only in a monoatomic layer. As a matter of course, repetition of the irradiation of the dissociated metallic ions 45 permit deposition of a plurality of atomic layers corresponding to the number of the irradiation (FIGS. 7(c) and 7(d)). The proper control in the number of the ion irradiation leads a controlled thickness of the deposited film in terms of atomic layers.

Example 5

Figure 8:
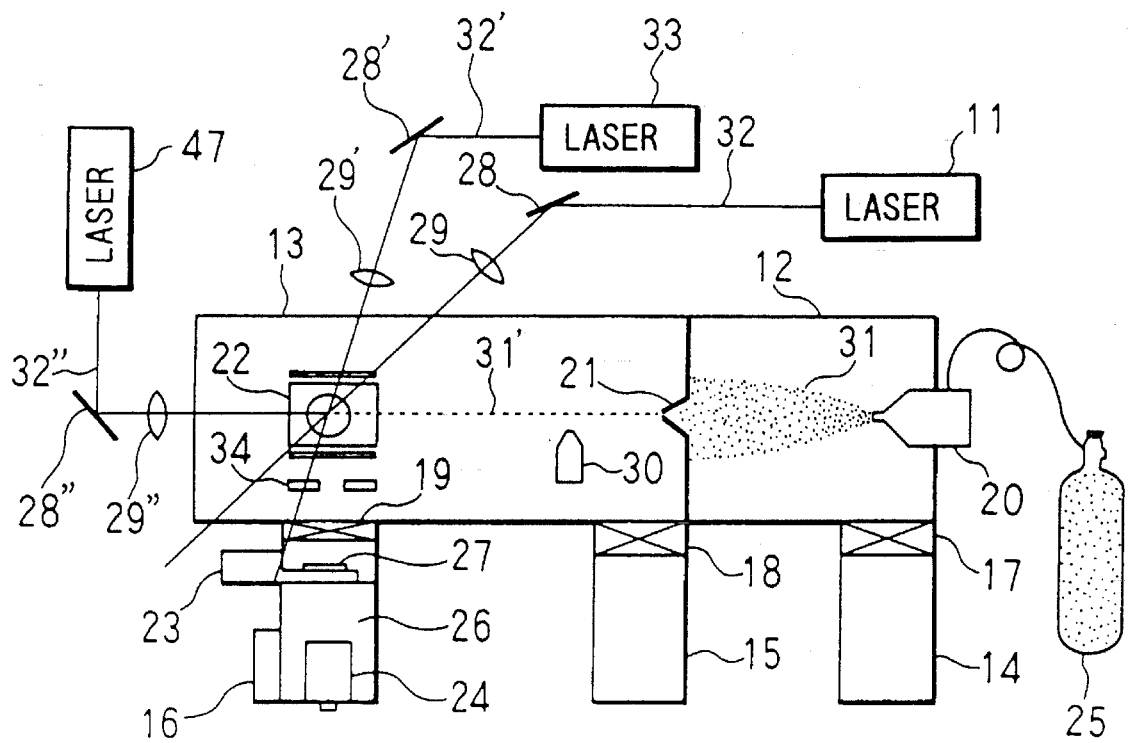
FIG. 8 is a schematic illustrative view of a fundamental arrangement of a surface treating apparatus using a laser cooling technique and an ion trap technique according to a further embodiment of the invention.
Figure 9:
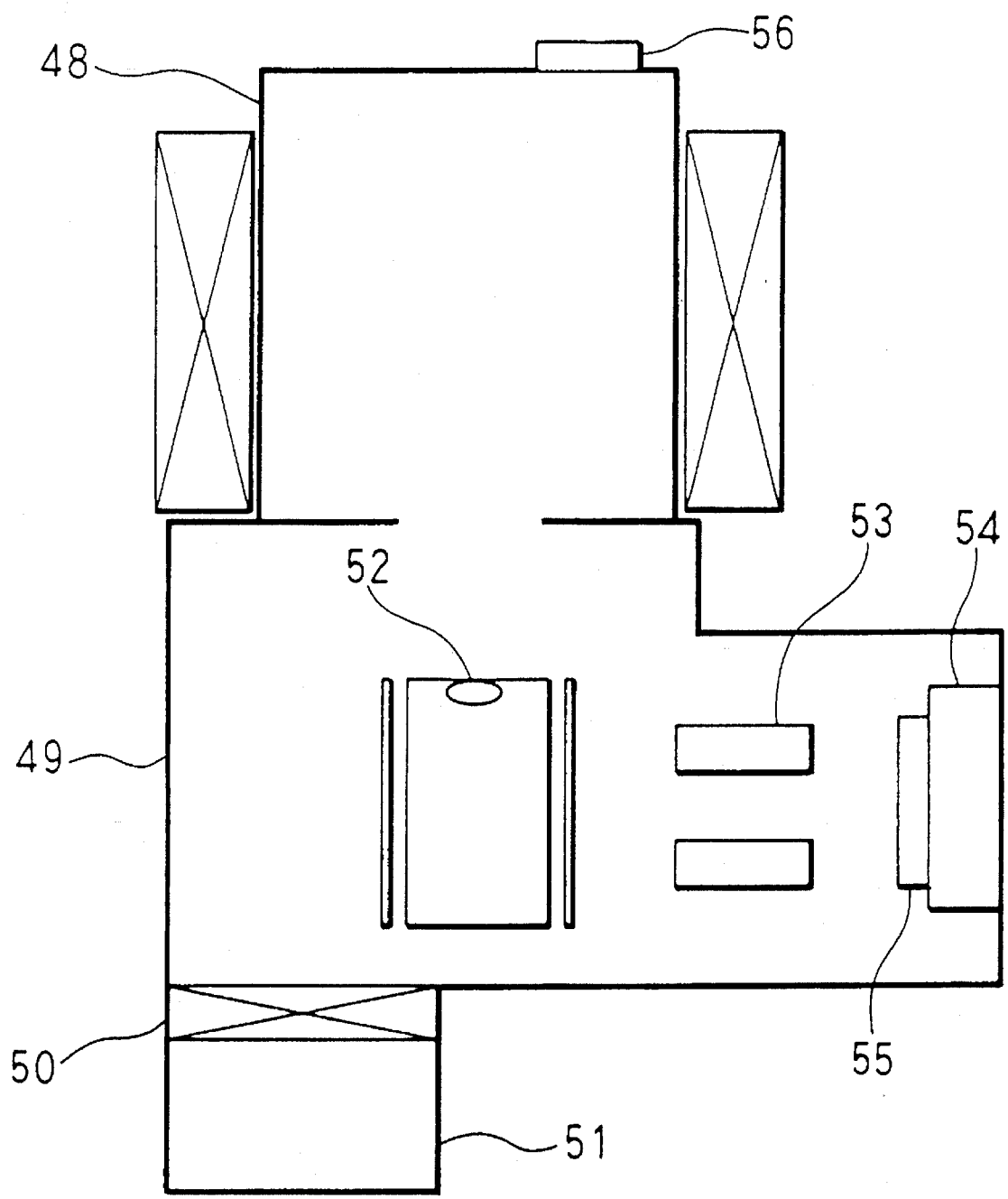
FIG. 9 is a schematic illustrative view showing a fundamental arrangement of a surface treating apparatus using a plasma generator according to a still further embodiment of the invention.

FIG. 8 shows a still further embodiment of the invention. In this embodiment, a laser cooling technique is utilized to suppress the movement of the ions trapped in the ion trap cell 22. In this embodiment, a laser beam 32" for laser cooling which is radiated from a laser 47 is introduced into the ion trap cell 22 through a mirror 28" and a lens 29". The other arrangement is similar to that of the apparatus shown in FIG. 2.

In this case, a starting material for ion generation is a vapor of an alkali metal or an alkaline earth metal. This vapor is introduced into the trap cell 22 in the form of a pulse molecular beam 31' in the same manner as in Example 1. In synchronism with the introduction of the pulse molecular beam, a short wave laser beam 32 or synchrotron radiation light is irradiated, so that the metallic molecules are ionized. The resulting metallic ions are trapped in the ion trap cell 22. Subsequently, the thus trapped ions are irradiated with the laser beam 32", thereby laser cooling the metallic ions. The laser cooling means a technique wherein ions are decelerated by utilizing a radiation pressure exerted on absorption or emission of light. By this, the metallic ions trapped in the ion trap cell 22 are suppressed from movement and almost stopped. The ions in an almost stopped state are extracted by the action of an electric field. By this, the surface treatment such as deposition as stated in Example 4 can be performed more precisely.

Example 6

This example deals with fabrication of novel types of built-up layer structures to which the method of the invention is applied. This embodiment is so arranged that chemical species of ions trapped in the ion trap cell 22 are selectively changed in type whenever ions are trapped. More particularly, (1) whenever trapped, different supersonic jets which are, respectively, made of materials capable of generating different types of chemical species are selectively generated one by one, (2) a single supersonic jet comprising a plurality of ion-generating substances is generated and arbitrary chemical species of ions are selectively generated by changing a wavelength of a laser beam 32 for ionization, and (3) ion-trapping conditions within the ion trap cell are so changed as to selectively change the type of chemical species of ions. One or two or more combinations of these techniques are adopted to change type of chemical ion species whenever trapped in the cell 22. Thus, different types of chemical ion species can be extracted from the ion trap cell 22 as desired and applied to the surface of the sample 27. This leads to deposition of a layer at an atomic level every cycle of the surface treatment procedure as stated in Example 5.

According to this embodiment, it is possible to deposit a desired number of layers which are, respectively, made of different types of chemical species. Thus, it will be possible to make a novel type of built-up structure having arbitrary compositional ratios of constituents. The compositional ratios become almost equal to the ratios of the ion irradiation numbers. If the order of the ion irradiation of the respective chemical species is changed, there may be prepared novel structures which have the same compositional ratios but different functions.

Example 7

This example deals with application of the method of the invention to modification of a sample surface. In this example, oxygen gas is used as a starting ion-generating gas and supplied to the supersonic jet generator 20. The oxygen gas is ionized in the same manner as in Example 1 and the resultant oxygen ions are trapped and extracted. The thus extracted oxygen ions are irradiated on a surface of the sample (Si substrate) 27, by which the sample surface is oxidized. The oxygen ions trapped as arranged in a two-dimensional plane are extracted at a very low speed and irradiated at one time on the surface of the Si substrate. By this, it becomes possible to uniformly oxidize (or modify) the uppermost surface layer alone of the Si substrate.

Example 8

This example deals with application of the invention to surface treatment using chemical species made of neutral atoms. Argon is used as chemical species. In the same manner as in Example 1, an atomic beam 31' of argon gas is generated and introduced into the ion trap cell 22. In this example, however, the ion trap cell 22 is not operated. The argon atom beam 31' introduced into the cell 22 is irradiated with a laser beam 32" from a direction opposite to the direction of movement of the beam 31', so that the movement of the argon atoms in the beam is stopped according to a laser cooling technique. The argon atoms are trapped at the stopped position. The thus trapped atoms are irradiated with a beam which moves in a direction along which the atoms are to be moved. The argon atoms are moved at a low speed by application of the radiation pressure of the beam and irradiated on the surface of the sample 27. Thus, the sample surface can be cleaned with a reduced degree of damage.

Example 9

FIG. shows a still further embodiment of the invention. In this example, a plasma generator is used to generate chemical species of ions which are applied to a sample surface. More particularly, a gas such as $SF_6$ is introduced from a gas introduction unit 56 into a plasma generation unit 48 wherein a plasma of the introduced gas is generated. Various chemical species of ions are formed in the thus generated plasma. A vacuum chamber 49 is connected to the laser generation unit 48 at a lower portion thereof. The vacuum chamber 49 is in turn connected to a vacuum pump 51 through a gate valve 50 and is evacuated to high vacuum by means of the vacuum pump 51. The stream of the chemical species formed in the plasma is passed into an ion trap cell 52 provided in the vacuum chamber 49, in which a specific and intended type of chemical ion species is trapped. Thereafter, the thus trapped ions are extracted toward a direction different from the direction of the stream of the chemical species from the plasma. The thus extracted ions are irradiated, through an ion lens 53, on a surface of a sample 55 placed on a sample mount 54. This enables one to very finely process the sample surface.

As will become apparent from the various embodiments and examples set out hereinbefore, with dry etching, chemical species which afford a reduced effect of etching are selectively removed to an extent as much as possible, thereby improving the selection ratio of etching. Moreover, the selected chemical species are used to have a uniformly controlled translational velocity, so that the anisotropy of etching can be improved. Further, since low speed chemical species can be applied to sample surfaces, the surfaces suffer only a low degree of damage by the etching. For deposition, ions which have such chemical properties as to prevent formation of a uniform thin film are eliminated to an extent as much as possible. The ions are arranged to have a uniform translational velocity, so that deposition of a thin film with a uniform quality is possible. In addition, preparation of compounds having arbitrary compositional ratios is possible along with a uniform surface modification of materials.

What is claimed is:

1. A surface treating method which comprises the steps of:
   (1) subjecting a gas for surface treatment to ionization to generate mixed chemical species containing a chemical species for the surface treatment by jetting said gas through a fine hole into vacuum to generate a molecular beam of said gas, and ionizing said molecular beam to generate the mixed chemical species containing the chemical species for the surface treatment;
   (2) selectively trapping the chemical species from the mixed chemical species at a given trapping position;
   (3) extracting the trapped chemical species from the given trapping position; and
   (4) supplying the extracted species onto a surface of an article to be treated.

2. A surface treating method according to claim 1, further comprising a step of exciting said chemical species to at least one energy level of internal state of not higher than 100 eV.

3. A surface treating method according to claim 1, wherein said molecular beam is ionized by irradiation of light on said molecular beam.

4. A surface treating method according to claim 1, wherein in the step (2), the chemical species of whose internal energies are not higher than 100 eV are selectively trapped.

5. A surface treating method according to claim 2, wherein in the exciting step, the chemical species extracted by the step (3) are excited.

6. A surface treating method according to claim 1, wherein in the extracting step (3), the chemical species whose translational energies are uniformly arranged are extracted.

7. A surface treating method according to claim 6, wherein the translational energies of said chemical species are not higher than 100 eV.

8. A surface treating method according to claim 6, wherein said translational energies are arranged within ±5% of an average value thereof.

9. A surface treating method according to claim 1, wherein in the step (2), said chemical species are trapped by an ion trapping technique.

10. A surface treating method according to claim 1, wherein in the step (2), said chemical species are trapped by laser cooling.

11. A surface treating method according to claim 2, wherein the exciting step comprises subjecting the chemical species to photo-excitation by irradiating said chemical species with a laser beam or a synchrotron radiation.

12. A surface treating method which comprises the steps of:
   (1) subjecting a gas for surface treatment to ionization to generate mixed chemical species containing a chemical species for the surface treatment by generating an atomic beam, a molecular beam or a cluster beam of said gas for the surface treatment, and ionizing any of the beams to generate the mixed chemical species;
   (2) selectively trapping the chemical species from the mixed chemical species at a given trapping position;
   (3) extracting the trapped chemical species from the given trapping position; and
   (4) supplying the extracted species onto a surface of an article to be treated.

13. A surface treating method according to claim 2, wherein not less than 50% of said chemical species have the same internal state.

* * * * *